US009166641B1

(12) United States Patent
Li et al.

(10) Patent No.: US 9,166,641 B1
(45) Date of Patent: Oct. 20, 2015

(54) METHOD AND APPARATUS FOR RECEIVER VGA ADAPTATION

(71) Applicant: ALTERA CORPORATION, San Jose, CA (US)

(72) Inventors: Wei Li, Fremont, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 92 days.

(21) Appl. No.: 13/928,038

(22) Filed: Jun. 26, 2013

(51) Int. Cl.
*H04B 1/18* (2006.01)

(52) U.S. Cl.
CPC ........................................ *H04B 1/18* (2013.01)

(58) Field of Classification Search
CPC .............. H04L 27/01; H04L 25/03885; H04L 2025/03681; H04L 25/03019; G06F 17/5063; H03G 2201/103; H03G 3/20; H04B 1/18
See application file for complete search history.

(56) References Cited

U.S. PATENT DOCUMENTS

| | | | |
|---|---|---|---|
| 5,796,778 A * | 8/1998 | Kurker | 375/229 |
| 6,229,397 B1 | 5/2001 | Miura | |
| 6,556,635 B1 | 4/2003 | Dehghan | |
| 7,277,510 B1 | 10/2007 | Kilani et al. | |
| 8,081,720 B1 | 12/2011 | Sutardja | |
| 8,260,155 B2 * | 9/2012 | Inoue | 398/209 |
| 8,401,064 B1 | 3/2013 | Lin et al. | |
| 2014/0015582 A1* | 1/2014 | Huang et al. | 327/211 |

* cited by examiner

*Primary Examiner* — Curtis Odom
(74) *Attorney, Agent, or Firm* — Okamoto & Benedicto LLP

(57) ABSTRACT

One embodiment relates to a receiver circuit for a data link. The receiver circuit includes a linear equalizer for receiving an input data signal and outputting an equalized signal, and a variable gain amplifier for receiving the equalized signal and outputting an amplified signal. Adaptation circuitry is connected to the linear equalizer and the variable gain amplifier. The adaptation circuitry adapts both a gain of the variable gain amplifier and a direct current voltage setting of the linear equalizer. Other embodiments and features are also disclosed.

17 Claims, 12 Drawing Sheets

100

FIG. 2    VGA adaptation method 200

Initialization 210

Procedure for time-up and done 500

Choose Sequential

Total stages = 4
Total settings = $N_{CTLE\_DACL}$ (a)

| 1 | 2 | 3 | 4 |
|---|---|---|---|
| 5 | 6 | 7 | 8 |
| . | . | . | . |
| 29 | 30 | 31 | 32 |

Stage 1  Stage 2  Stage 3  Stage 4

(b)

| 1 | 3 | 5 | 7 |
|---|---|---|---|
| 2 | 4 | 6 | 8 |
| . | . | . | . |
| 29 | 30 | 31 | 32 |

Stage 1  Stage 2  Stage 3  Stage 4

(c)

| 1 | 9 | 17 | 25 |
|---|---|----|----|
| 2 | 10 | 18 | 26 |
| .. | .. | .. | .. |
| 8 | 16 | 24 | 32 |

Stage 1  Stage 2  Stage 3  Stage 4

CTLE DC DAC Sequential Tables

*FIG. 7*

METHOD AND APPARATUS FOR RECEIVER VGA ADAPTATION

BACKGROUND

1. Technical Field

The present invention relates generally to data communications. More particularly, the present invention relates to circuitry for high-speed data links.

2. Description of the Background Art

High-speed data links are used to communicate data between devices in a system. Serial interface protocols have been developed at increasingly fast data rates for such high-speed data links.

SUMMARY

One embodiment relates to a receiver circuit for a data link. The receiver circuit includes a linear equalizer for receiving an input data signal and outputting an equalized signal, and a variable gain amplifier for receiving the equalized signal and outputting an amplified signal. Adaptation circuitry is connected to the linear equalizer and the variable gain amplifier. The adaptation circuitry adapts both a gain of the variable gain amplifier and a direct current voltage setting of the linear equalizer.

Another embodiment relates to an integrated circuit with a serial data receiver. The serial data receiver includes a variable gain amplifier and adaptation logic connected the variable gain amplifier. The adaptation logic triggers adaptation of a gain the variable gain amplifier based on one or more trigger conditions.

Another embodiment relates to a method of adaptation of a VGA and a linear equalizer in an integrated circuit. In the method, error signs are accumulated while incrementing an update counter, incrementing an error counter for positive sign errors, and decrementing the error counter for negative sign errors. A determination may be made as to whether the update counter is greater than the error counter. Upon the update counter being greater than the error counter, a determination may be made as to whether the adaptation of the variable gain amplifier is done. If so, then the gain of the variable gain amplifier and a direct current of the linear equalizer may be frozen. If not, then a further determination may be made as to whether a time-up condition is satisfied.

Other embodiments and features are also disclosed.

BRIEF DESCRIPTION OF THE DRAWINGS

FIG. 7 is a diagram showing exemplary digital-to-analog conversion (DAC) sequential tables for CTLE DC adaptation in accordance with an embodiment of the invention.

DETAILED DESCRIPTION

The present disclosure provides innovative apparatus and methods for voltage gain amplifier (VGA) adaptation.

In accordance with an embodiment of the invention, VGA adaptation may be triggered by one or more conditions after the completion of the power-up adaptation. A first condition may be based on threshold migration outside a predetermined range of thresholds. Another condition may be controlled by a VGA timer which may activate VGA adaptation in a certain period of time to prevent threshold migration.

In accordance with another embodiment of the invention, the VGA adaptation may achieve amplitude regulation by combining tuning of a direct current (DC) voltage level of a continuous-time linear equalizer (CTLE) into the VGA adaptation procedure. This extended VGA adaptation function widens the DC regulation range and also facilitates CTLE alternating current (AC) adaptation to achieve maximum AC equalization without loss of DC amplitude.

Figure 1:
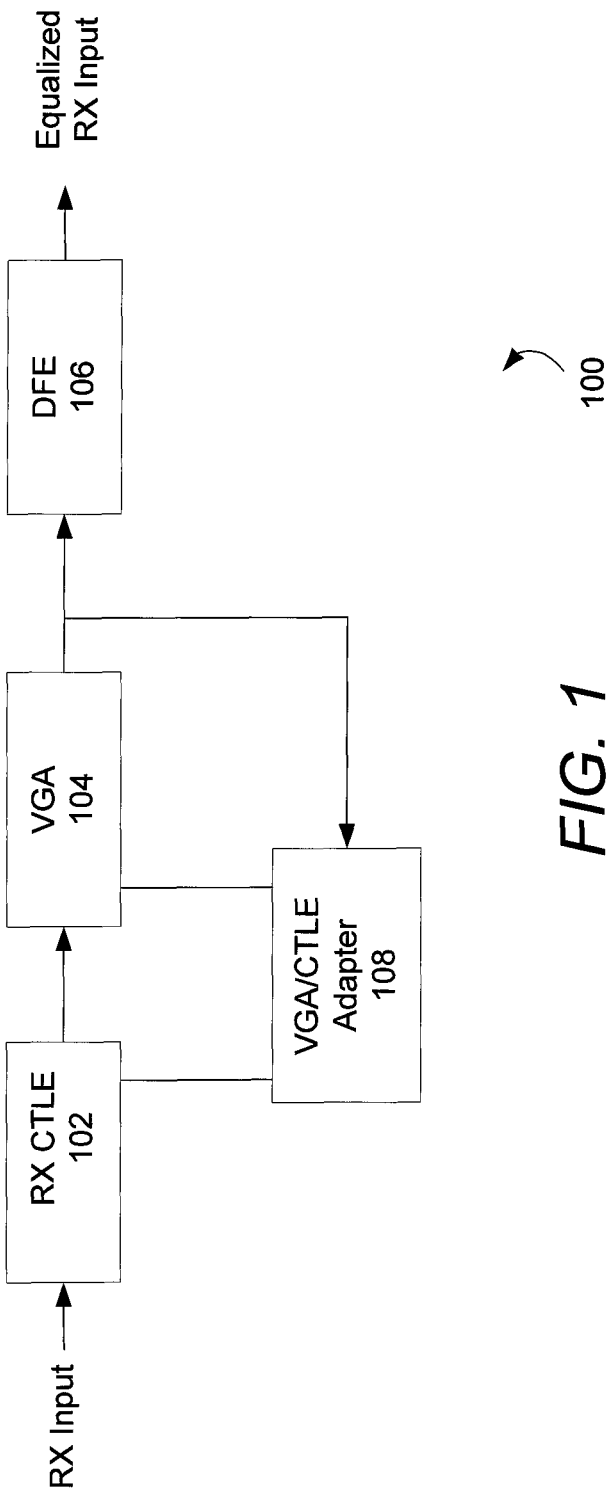
FIG. 1 depicts a receiver circuit for a high-speed serial data link in accordance with an embodiment of the invention.

FIG. 1 depicts a receiver (RX) circuit 100 for a high-speed serial data link in accordance with an embodiment of the invention. As depicted in FIG. 1, receiver equalization may use a continuous-time linear equalizer (CTLE) 102 combined with decision feedback equalization (DFE) 106 to overcome high-frequency losses through a transmission channel. Signal amplitude after channel transmission and the CTLE 102 may increase or decrease depending on the channel loss and the boost amount of the CTLE 102 at different frequencies. Hence, the input amplitude to the DFE 106 may be over or under the desired operating range for maximal equalization.

As further shown in FIG. 1, a VGA 104 may be used in a receiver system with a goal of providing a more constant amplitude for the signal input into the DFE 106. However, it is challenging for a VGA 104 to accommodate the amplitude variations for different channels and CTLE settings, particularly for high-speed transceivers in field programmable gate arrays that need to support a multitude of standards.

In accordance with an embodiment of the invention, a VGA/CTLE adapter circuitry 108 may be used to adjust both the gain of the VGA and the direct current (DC) voltage level of the CTLE 106. The VGA/CTLE adapter circuitry 108 may be implemented using hard-wired circuitry, electronically-programmable circuitry, or a combination of both.

Figure 2:
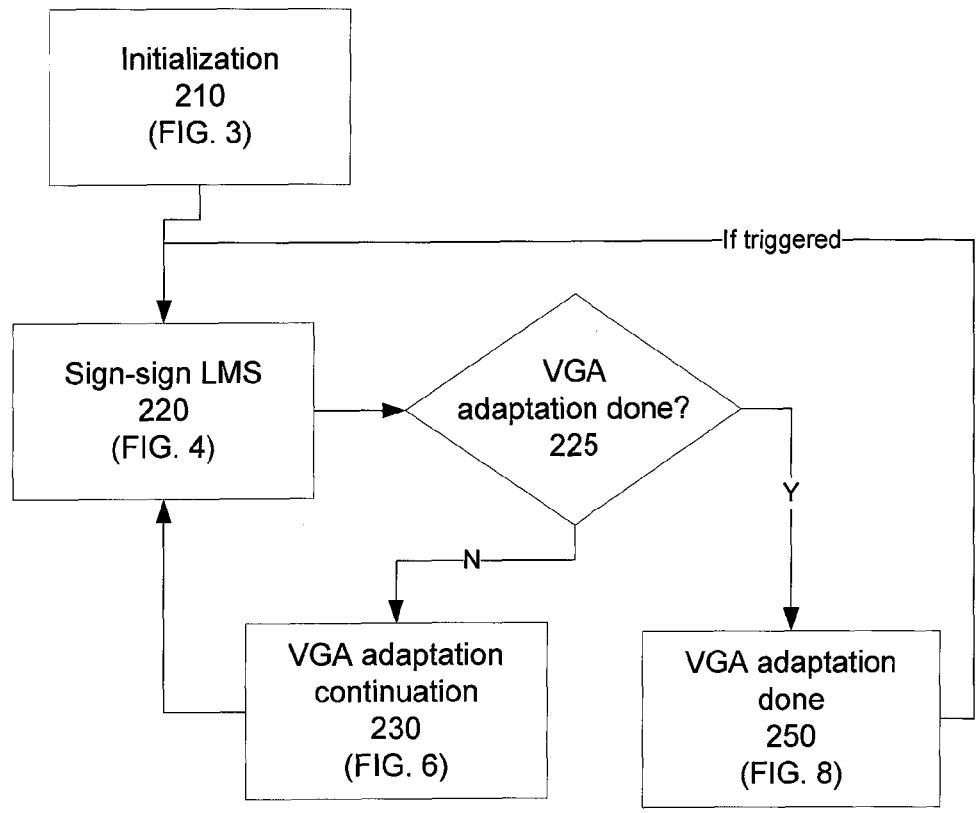
FIG. 2 is a flow chart of a method for VGA adaptation in accordance with an embodiment of the invention.

FIG. 2 is a flow chart of an exemplary method 200 for VGA adaptation in accordance with an embodiment of the invention. In one implementation, the method 200 may be implemented using the VGA/CTLE adapter circuitry 108 of FIG. 1. As shown in FIG. 2, the method 200 may begin with an initialization procedure 210. An exemplary implementation of the initialization procedure 210 is described below in relation to FIG. 3.

After the initialization procedure 210, a sign-sign least mean squares (LMS) procedure 220 may be performed until the VGA gain is within a specified range such that convergence is detected. An exemplary implementation of the sign-sign LMS procedure 220 is described below in relation to FIG. 4.

After convergence is detected, the method 200 may move forward to block 225 and determine whether or not VGA adaptation is "done". In one implementation, VGA adaptation is considered as done if a VGA adaptation done flag is set. Described below in relation to FIG. 5 is an exemplary implementation of a procedure 500 for setting the VGA adaptation done flag.

If the VGA adaptation is determined to not yet be done per block 225, then the adaptation continues per the VGA-adaptation-continuation procedure 230. An exemplary implementation of the VGA-adaptation-continuation procedure 230 is described below in relation to FIG. 6. In accordance with an embodiment of the invention, during the VGA-adaptation-continuation procedure 230, a CTLE DC adaptation may be performed. Thereafter, the method 200 loops back to the sign-sign LMS procedure 220.

Once the VGA adaptation is determined to be done per block 225, then the adaptation continues per the VGA-adaptation-done procedure 250. An exemplary implementation of the VGA-adaptation-done procedure 250 is described below in relation to FIG. 8. If the VGA adaptation was a triggered adaptation, then the method 200 loops back to the sign-sign LMS procedure 220. Otherwise, if the VGA adaptation was a non-triggered adaptation, such as a one-time adaptation, then the method 200 may end (i.e. be complete or done) in the VGA-adaptation-done procedure 250.

Figure 3:
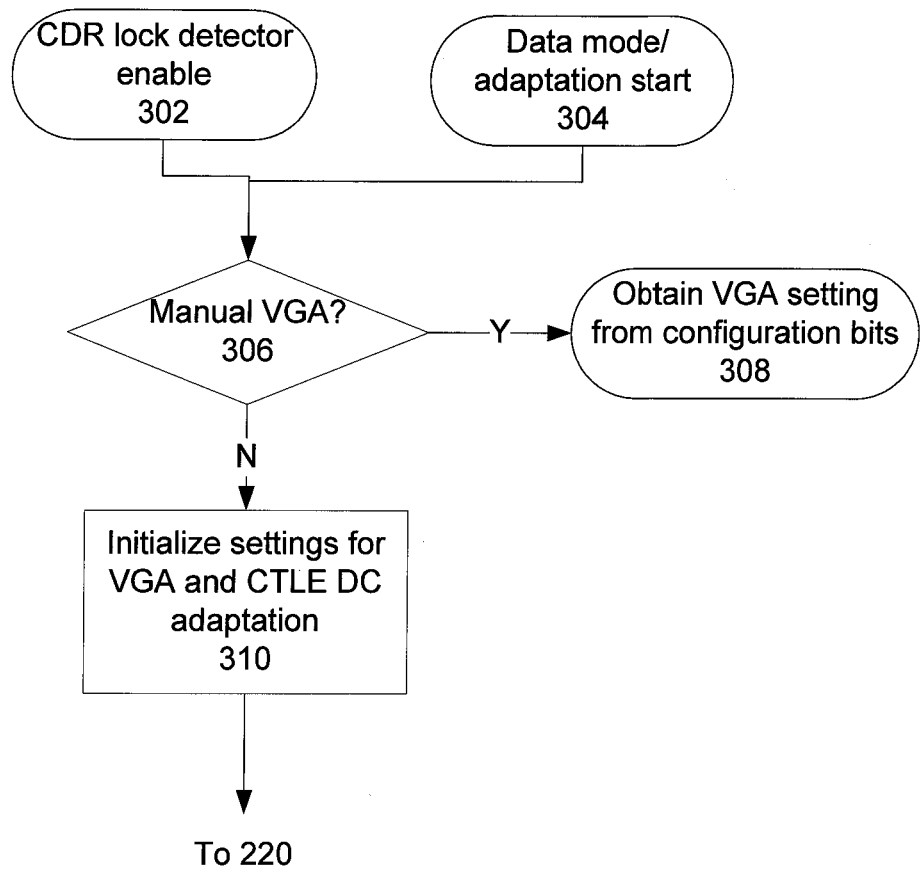
FIG. 3 is a flow chart of an initialization procedure in accordance with an embodiment of the invention.

FIG. 3 is a flow chart of an initialization procedure 210 in accordance with an embodiment of the invention. The procedure 210 may start when either a clock data recover (CDR) lock detector is enabled 302 or a data mode or adaptation is started 304. Thereafter, a determination 304 may be made as to whether or not the system is set to a manual VGA mode. In such a manual VGA mode, the VGA is set to a fixed gain. Hence, if the system is set to the manual VGA mode, then the VGA setting may be obtained 308 from configuration bits.

On the other hand, if the system is not set to the manual VGA mode, then the settings for the VGA and CTLE DC adaptation may be initialized 310. In an exemplary implementation, the initialization of the settings may include: setting an initial voltage threshold (Vth); setting the initial gain for the VGA (VGA initial) to 0 dB; setting the initial value for the error count ($N_{VGA}$) to an initial low error count ($N_{VGAL}$); setting the VGA maximum and minimum digital-to-analog converter (DAC) values to $M_{max}$ and $M_{min}$, respectively; and setting the initial gain for the CTLE DC to 0 dB. After initializing the settings, the method 200 may proceed to the sign-sign LMS procedure 220.

Figure 4:
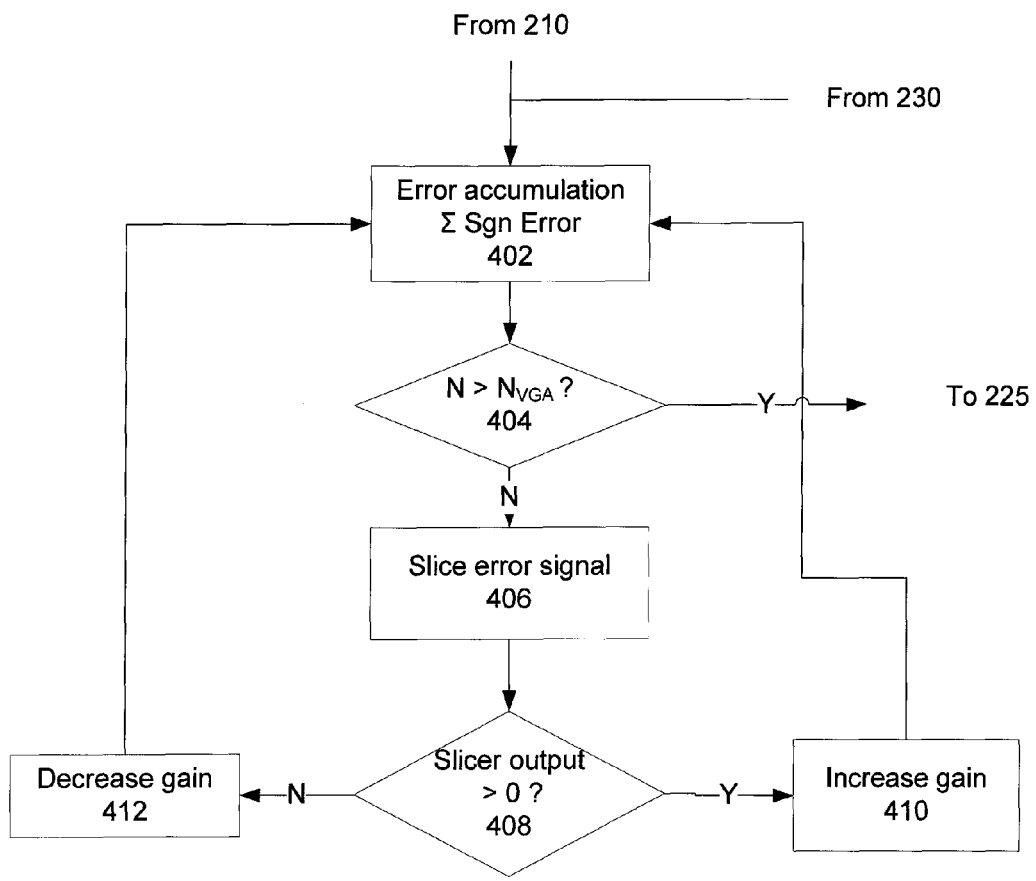
FIG. 4 is a flow chart of a sign-sign LMS procedure in accordance with an embodiment of the invention.

FIG. 4 is a flow chart of a sign-sign LMS procedure 220 in accordance with an embodiment of the invention. Error accumulation may be performed per block 402. The error accumulation may involve a summation of the signs of detected errors (Σ Sgn Error).

Per block 404, after a predetermined period of accumulation, a determination may be made as to whether the VGA update counter N is greater than the error counter $N_{VGA}$. If VGA update counter N is less than or equal to the error counter $N_{VGA}$, then an error slicer may be applied per block 406 to generate a slice error signal. Per block 408, if the slicer output is greater than zero (i.e. positive), then the gain for the VGA may be increased per block 410, while if the slicer output is less than zero (i.e. negative), then the gain for the VGA may be decreased per block 412. The procedure 220 may then loop back to further accumulate error per block 402. Once it is determined that N is greater than $N_{VGA}$, then the method 200 may proceed to block 225 in which a determination is made as to whether or not the VGA adaptation is "done".

Figure 5A:
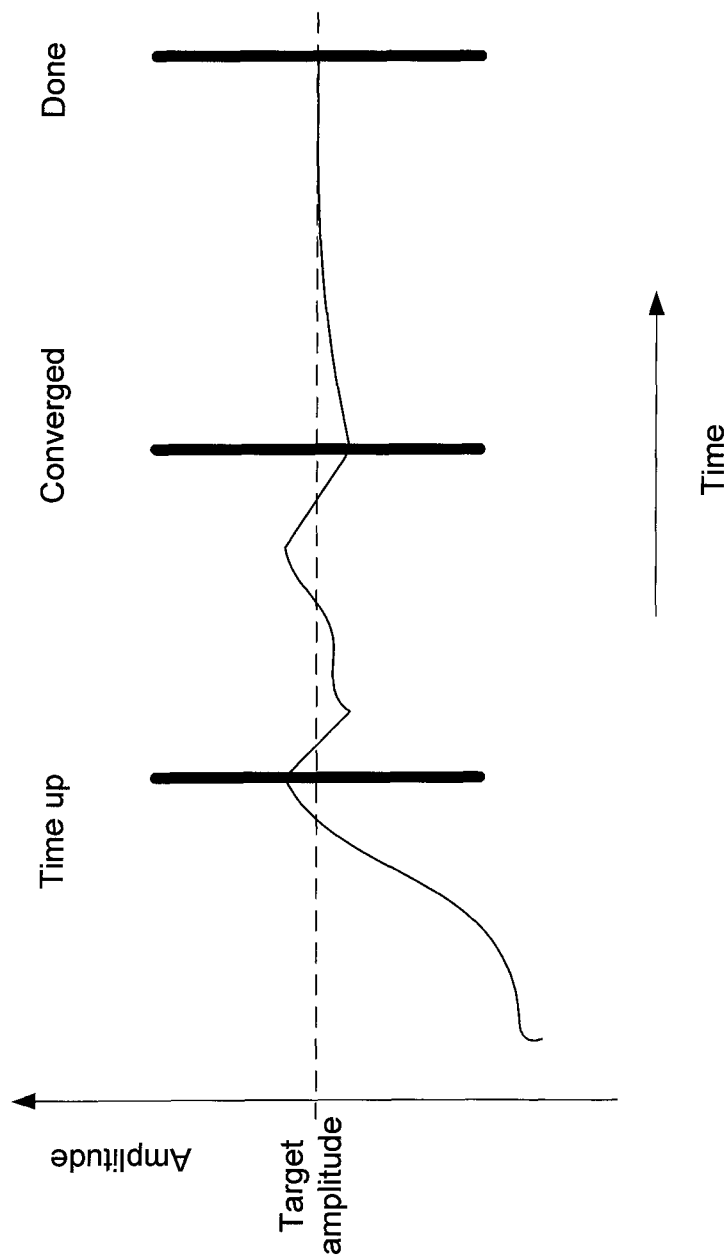
FIG. 5A is an example graph depicting VGA adaptation time-up, converged, and done conditions in accordance with an embodiment of the invention.

FIG. 5A is an example graph depicting VGA adaptation "time-up", "converged", and "done" conditions in accordance with an embodiment of the invention. As depicted, during an initial period in the VGA adaptation before VGA adaptation "time-up", the adaptation of the gain occurs rapidly (i.e. at high bandwidth). Thereafter, in accordance with an embodiment of the invention, the VGA adaptation may be switched from a high bandwidth setting (i.e. larger changes in gain per step) to low bandwidth setting (i.e. smaller changes in gain per step). Thereafter, the VGA adaptation may continue until the VGA adaptation "converged" condition is met. Finally, the VGA adaptation may be deemed as "done" if the converged condition has been met for a sufficiently long period of time.

Figure 5B:
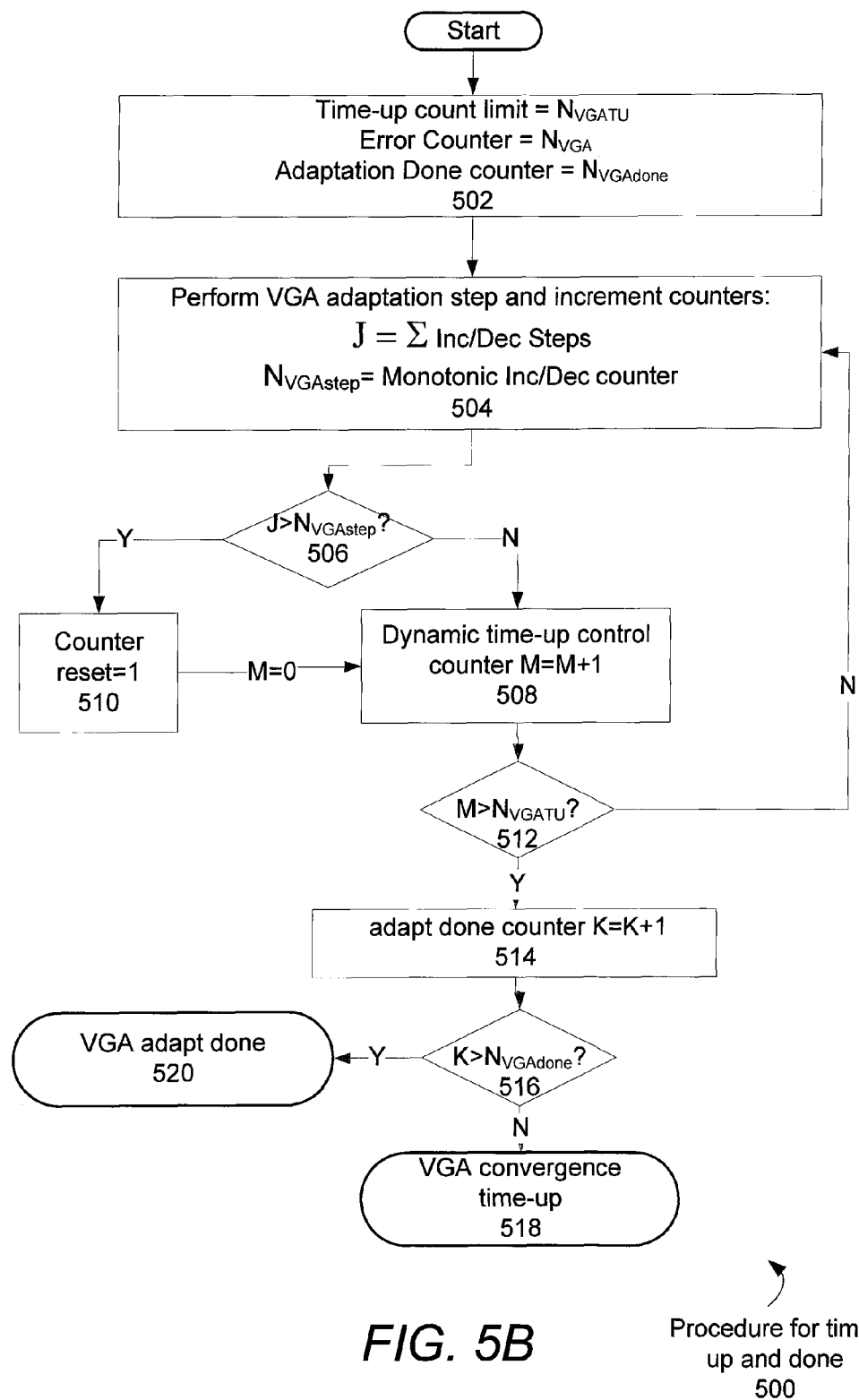
FIG. 5B depicts a flow chart of a procedure for determining VGA convergence time-up and VGA adaptation done in accordance with an embodiment of the invention.

FIG. 5B depicts a flow chart of a procedure 500 for determining VGA convergence time-up and VGA adaptation done in accordance with an embodiment of the invention. Note that this procedure 500 executes in parallel with the steps of the method 200 shown in FIG. 2. In one implementation, the following counts may be set per block 502: time-up count $N_{VGATU}$; and adaptation done count $N_{VGAdone}$. Both these counts may be set to predetermined (i.e. electronically programmed) values.

Per block 504, a VGA step counter J may be incremented for either increment or decrement steps, while a monotonic step counter $N_{VGAstep}$ may be incremented or decremented only while the gain is being incremented or decremented monotonically.

Per block 506, the value of the VGA step counter J may be compared against the value of the monotonic counter $N_{VGAstep}$. If $J=N_{VGAstep}$, then the gain adjustment remains monotonic (either monotonically incremented or monotonically decremented). In this case, per block 508, the dynamic time-up control counter M is incremented.

On the other hand, if $J>N_{VGAstep}$, then a change in sign has occurred such that the gain adjustment has gone from being incremented to being decremented, or vice-versa. In that case, per block 510, both counters J and $N_{VGAstep}$ are reset to one, and the dynamic time-up control counter M is reset to zero.

Per block 512, a determination may then be made as to whether M is greater than the time-up count $N_{VGATU}$. If not, then the procedure 500 may loop back to block 504.

Once $M>N_{VGATU}$, then the adaptation done counter K may be incremented per block 514. Per block 516, a determination may be made as to whether the adaptation done counter K is greater than the adaptation done count limit $N_{VGAdone}$. If not, then the VGA convergence "time-up" flag may be set per block 518, and the bandwidth for the adaptation may be lowered as discussed above. If so, then the VGA adaptation done flag may be set per block 520, indicating that the VGA adaptation is deemed "done" as discussed above.

Figure 6:
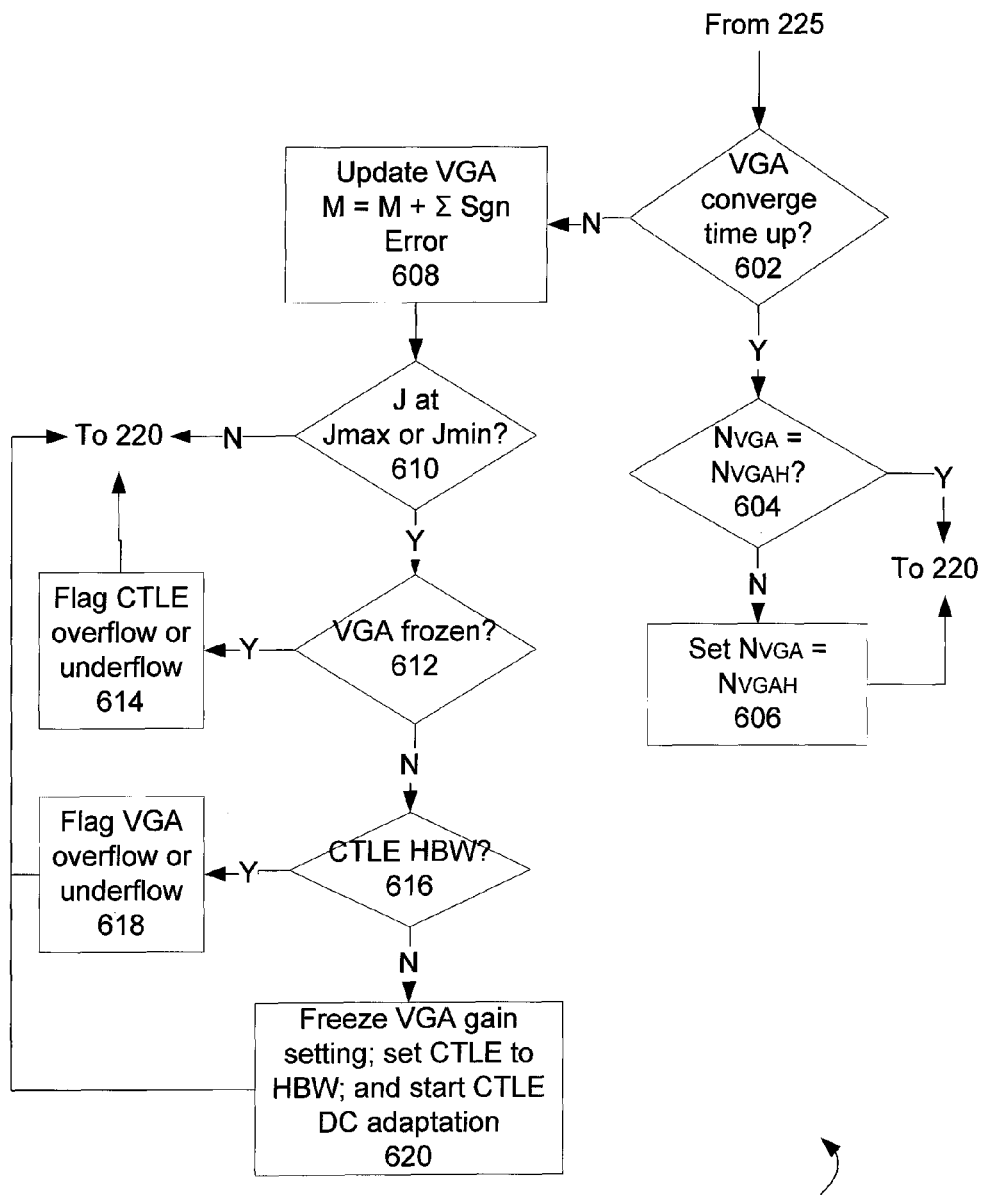
FIG. 6 is a flow chart of a VGA-adaptation-continuation procedure in accordance with an embodiment of the invention.

FIG. 6 is a flow chart of a VGA-adaptation-continuation procedure 230 in accordance with an embodiment of the invention. This procedure 230 begins after it is determined, per block 225, that VGA adaptation is not "done". In this case, a determination may then be made, per block 602, as to whether the VGA convergence "time-up" flag has been set.

If the convergence "time-up" flag is set per block 602, then the process is at or after the "time-up" point, but before the "done" point, in FIG. 5A. In this case, the error counter $N_{VGA}$ is set to the high error count $N_{VGAH}$ (if not already) per blocks

604 and 606. Thereafter, the method 200 may loop back and again perform the sign-sign LMS procedure 220.

If the convergence "time-up" flag is not set per block 602, then the process is before the "time-up" point in FIG. 5A. In this case, the VGA gain J is updated by incrementing it based on the accumulated sign error per block 608.

Per block 610, a determination may be made as to whether the updated VGA gain J is at a maximum or minimum allowed value ($J_{max}$ or $J_{min}$, respectively). If J is not at $J_{max}$ or $J_{min}$, then the method 200 may loop back and again perform the sign-sign LMS procedure 220. If $J=J_{max}$ or $J_{min}$, then a further determination may be made, per block 612, as to whether the VGA setting has already been frozen, and if so, then a CTLE overflow (if $J=J_{max}$) or underflow (if $J=J_{min}$) may be flagged per block 614.

Otherwise, the VGA setting is not already frozen, then a further determination may be made, per block 616, as to whether the CTLE DC adaptation is set to a higher bandwidth setting, rather than a lower bandwidth setting. If the CTLE DC adaptation is already set to the higher bandwidth setting, then a VGA overflow or underflow may be flagged per block 618. Otherwise, if the CTLE DC adaptation is set to not set to the higher bandwidth setting, then, per block 620, the VGA gain setting may be frozen, the CTLE DC adaptation may be set to the higher bandwidth setting, and the CTLE DC adaptation may be performed. An exemplary implementation of DAC sequence for the CTLE DC adaptation is described below in relation to FIG. 7.

FIG. 7 is a diagram showing exemplary DAC sequential tables for CTLE DC adaptation in accordance with an embodiment of the invention. In this example, the CTLE has four stages, and three exemplary DAC sequential tables are shown.

The first sequential table (a) provides a first sequence which may be used as a default sequence. In this sequence, the first (weakest) stage may be set to a first (lowest) setting, then the second stage may be set to the first (lowest) setting, then the third stage may be set to the first (lowest) setting, then the fourth (strongest) stage may be set to the first (lowest) setting. These first four settings in the sequence are denoted 1, 2, 3 and 4 in the first row. For the fifth through eighth settings in the sequence, the first stage may be set to a second setting, then the second stage may be set to the second setting, then the third stage may be set to the second setting, then the fourth stage may be set to the second setting. These next four settings in the sequence are denoted 5, 6, 7, and 8 in the second row. And so on, until the $29^{th}$ through $32^{nd}$ in the sequence, in which the first through fourth stages, respectively, may be set to the eighth setting.

The second sequential table (b) provides a second sequence which may be used for small signals. In this sequence, the first stage may be set to a first (lowest) setting, then the first stage may be set to a second setting, then the second stage may be set to the first (lowest) setting, then the second stage may be set to a second setting, then the third stage may be set to the first (lowest) setting, then the third stage may be set to a second setting, then the fourth stage may be set to the first (lowest) setting, then the fourth stage may be set to the second setting. These first eight settings in the sequence are denoted 1, 2, 3, 4, 5, 6, 7 and 8 in the first two rows. Similarly for the next group of eight settings in the sequence, and so on.

The third sequential table (c) provides a third sequence which may be used for very small signals. In this sequence, the first stage may be set to a first (lowest) setting, then a second setting, then a third setting, and so on, until an eight (highest) setting. These first eight settings in the sequence are denoted 1, 2, ..., 8 in the first column. The next eight settings in the sequence pertain to the second stage and are denoted 9, 10, ..., 16 in the second column. Similarly, the next group of eight settings pertain to the third stage and are denoted 17 through 24 in the fourth column. Finally, the last group of eight settings pertain to the fourth stage and are denoted 25 through 32 in the fourth column.

Figure 8:
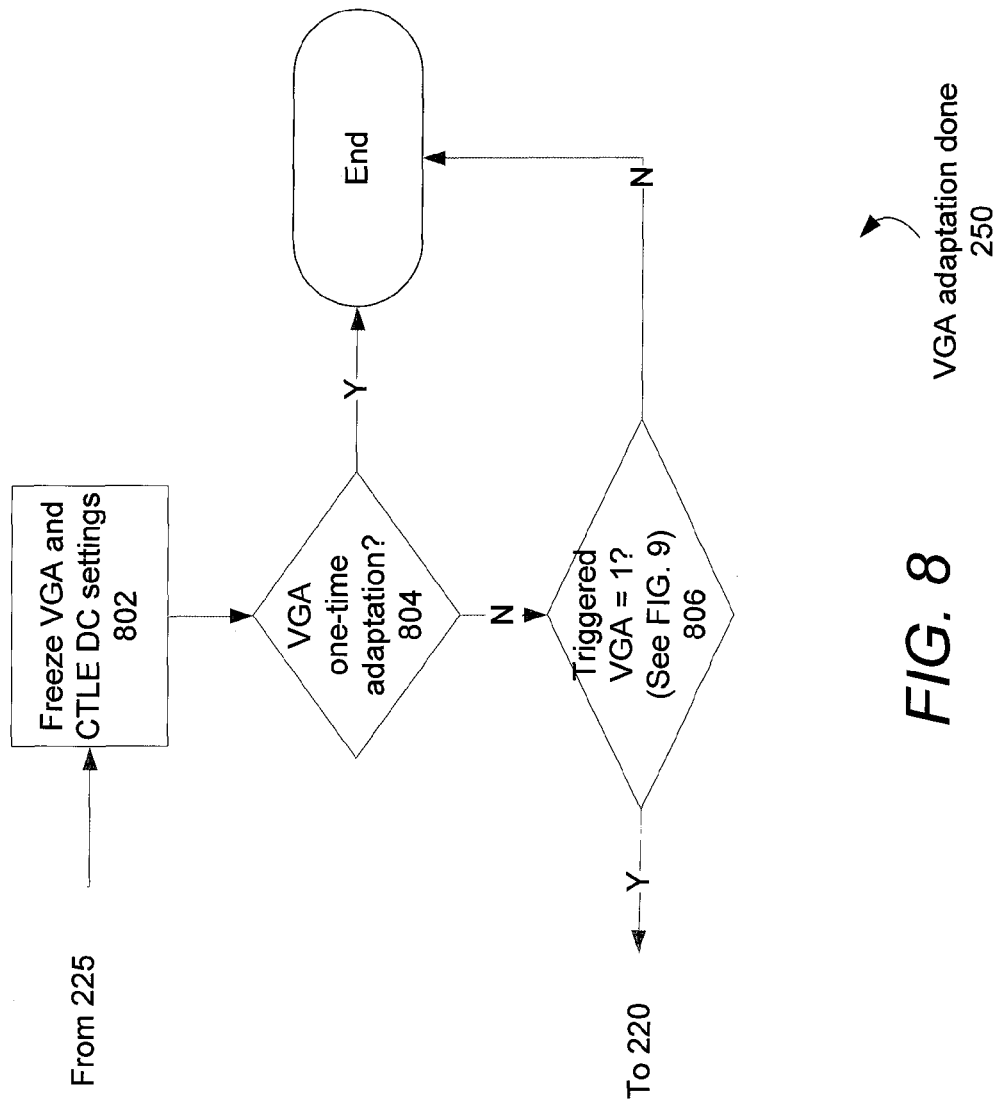
FIG. 8 is a flow chart of a VGA-adaptation-done procedure in accordance with an embodiment of the invention.

FIG. 8 is a flow chart of a VGA-adaptation-done procedure 250 in accordance with an embodiment of the invention. This procedure 250 is performed if the VGA adaptation is determined to be done per block 225.

Per block 802, the VGA and CTLE DC settings are frozen. A determination may be made, per block 804, whether the VGA adaptation was performed as a one-time adaptation. If so, then the method 200 may end. Otherwise, a further determination may be made, per block 806, as to whether the VGA adaptation was triggered. For example, this may be indicated by a triggered VGA flag being set to one. If the VGA adaptation was not triggered, then the method 200 may end. Otherwise, if the VGA adaptation was triggered, then the method 200 may loop back to the sign-sign LMS procedure 220.

Figure 9:
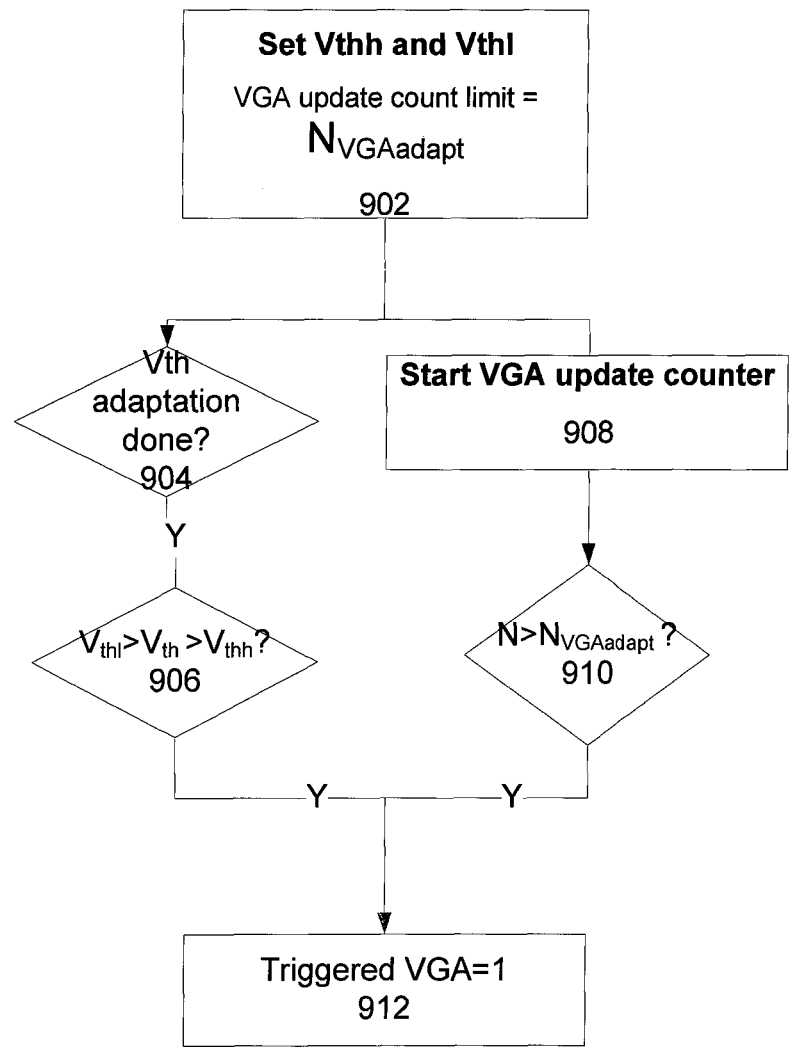
FIG. 9 is a flow chart for triggering a VGA adaptation in accordance with an embodiment of the invention.

FIG. 9 is a flow chart of a procedure 900 to determine whether triggering a VGA adaptation in accordance with an embodiment of the invention. Per block 902, high-level and low-level threshold voltages may be set to predetermined voltages Vthh and Vthl, respectively, and a VGA update count limit may be set to a predetermined count $N_{VGAadapt}$. After block 902, the procedure 900 may proceed in parallel along two branches: a first branch (blocks 904 and 906) relating to a threshold migration trigger; and a second branch (blocks 908 and 910) relating to a VGA timer trigger.

In the first branch, adaptation of the threshold voltage Vth is performed. When the Vth adaptation is done per block 904, then Vth may be compared against the low and high thresholds Vthl and Vthh per block 906. If Vth is below Vthl or above Vthh (i.e. outside the range bounded by Vthl and Vthh), then the triggered VGA flag may be set to one per block 912.

In the second branch, the VGA update counter N may be started per block 908. Per block 910, the VGA update counter N is monitored and compared against $N_{VGAadapt}$. When $N>N_{VGAadapt}$, then the triggered VGA flag may be set to one per block 912.

Figure 10:
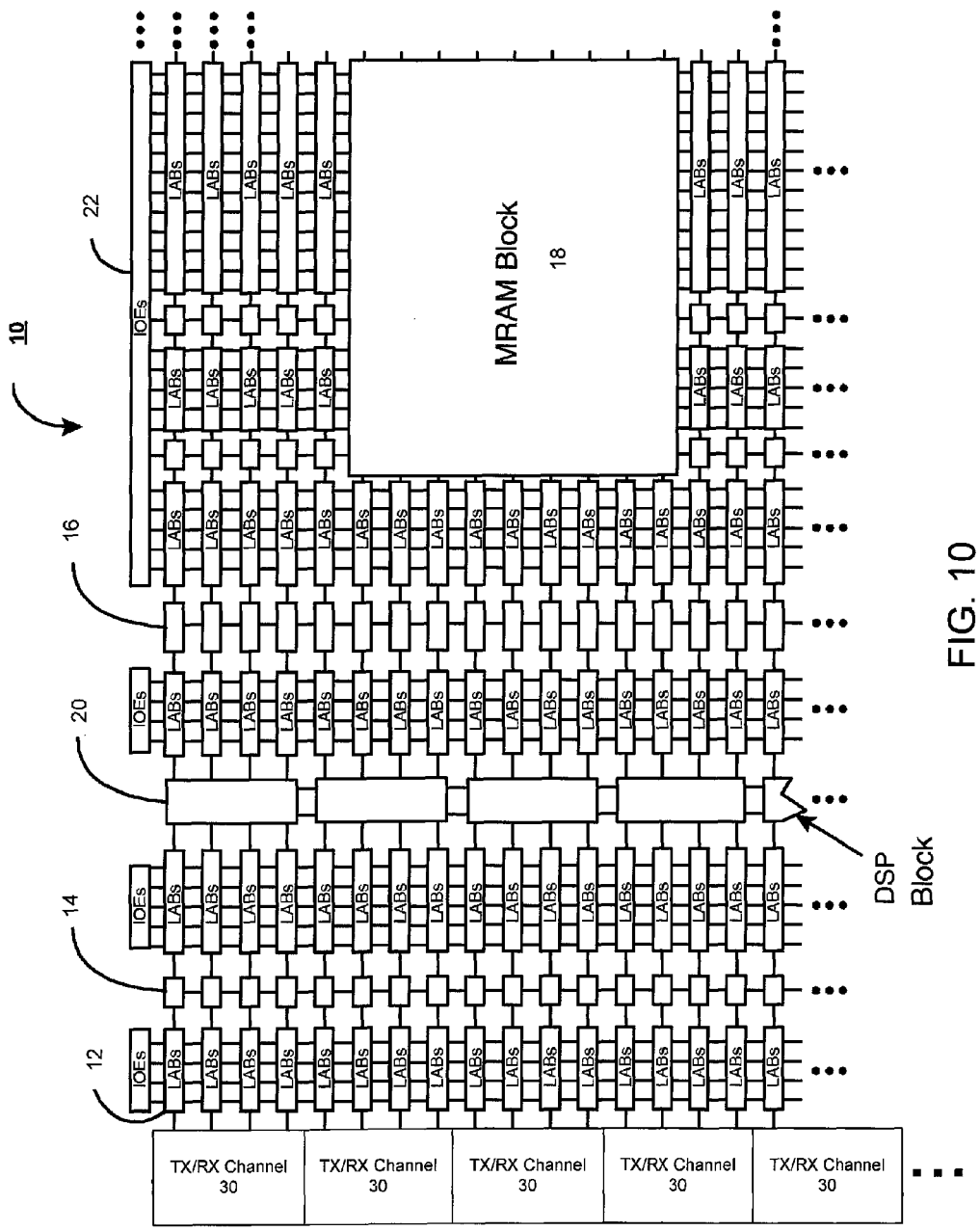
FIG. 10 is a simplified partial block diagram of a field programmable gate array (FPGA) that can include aspects of the present invention.

FIG. 10 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, the receiver circuitry described herein.

It is to be understood that FPGA 10 is described herein for illustrative purposes only and that the present invention can be implemented in many different types of PLDs, FPGAs, and ASICs.

Figure 11:
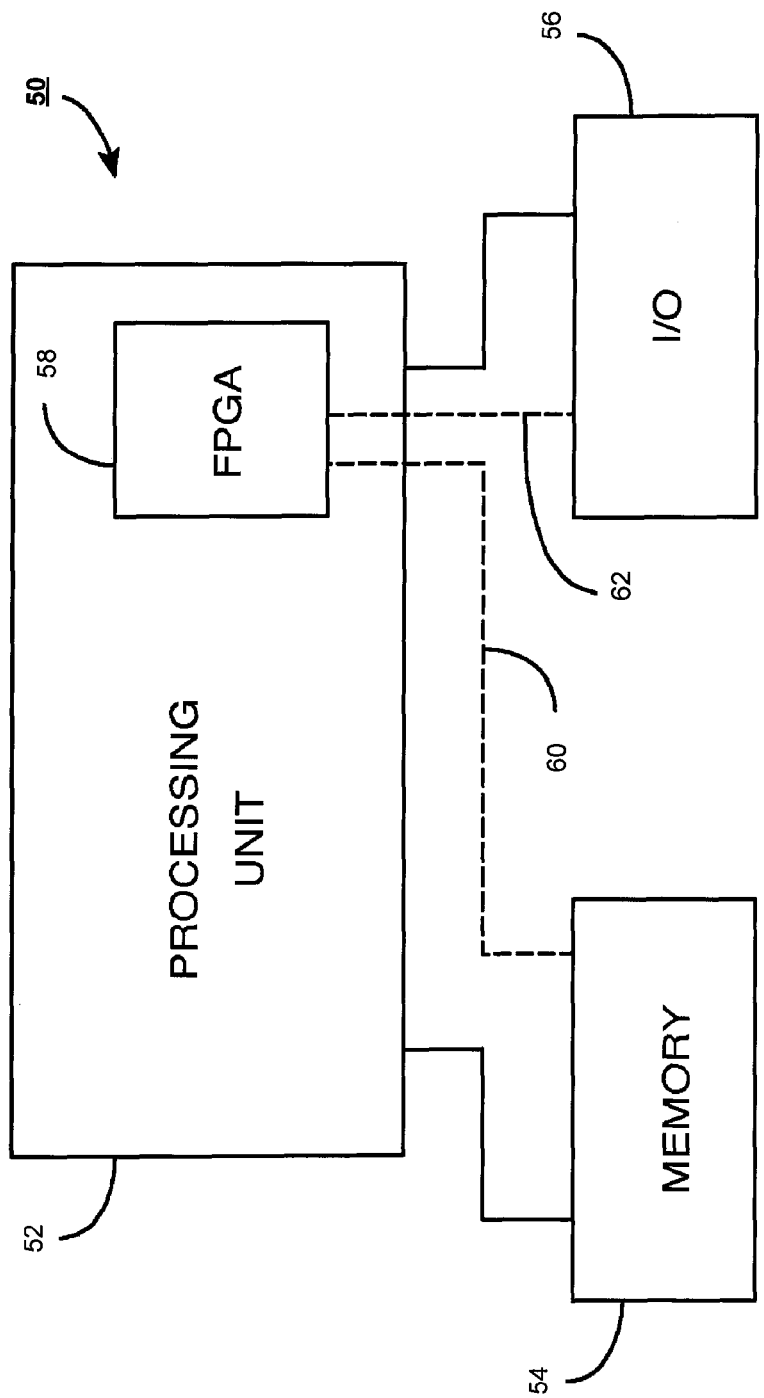
FIG. 11 shows a block diagram of an exemplary digital system 50 that includes an FPGA as one of several components and that may employ techniques of the present invention.

FIG. 11 shows a block diagram of an exemplary digital system 50 that includes an FPGA as one of several components and that may employ techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A receiver circuit for a data link, the receiver circuit comprising:
    a linear equalizer for receiving an input data signal and outputting an equalized signal;
    a variable gain amplifier for receiving the equalized signal and outputting an amplified signal; and
    adaptation circuitry connected to the linear equalizer and the variable gain amplifier, wherein the adaptation circuitry adapts both a gain of the variable gain amplifier and a direct current voltage setting of the linear equalizer,
    wherein the adaptation circuitry comprises adaptation logic that changes the direct current voltage setting of the linear equalizer when the gain of the variable gain amplifier is at a limit and further adaptation of the variable gain amplifier is determined to be needed.

2. The receiver circuit of claim 1, wherein the adaptation logic triggers adaptation of the gain of the variable gain amplifier when a voltage threshold for the variable gain amplifier is detected to be outside a predetermined range.

3. The receiver circuit of claim 1, wherein the adaptation logic triggers adaptation of the gain of the variable gain amplifier when a variable gain amplifier update counter reaches a predetermined count.

4. The receiver circuit of claim 1, wherein the adaptation logic triggers adaptation of the gain of the variable gain amplifier when either a voltage threshold for the variable gain amplifier is detected to be outside a predetermined range, or a variable gain amplifier update counter reaches a predetermined count.

5. An integrated circuit with a serial data receiver,
    the serial data receiver comprising:
    a variable gain amplifier for receiving a data signal and outputting an amplified data signal;
    adaptation logic connected to the variable gain amplifier, wherein the adaptation logic triggers adaptation of a gain of the variable gain amplifier based on one or more trigger conditions; and
    a continuous time linear equalizer for equalizing the data signal prior to the data signal being received by the variable gain amplifier, wherein the adaptation logic changes a direct current voltage setting of the continuous time linear equalizer when the gain of the variable gain amplifier is at a limit and further adaptation of the variable gain amplifier is to be performed.

6. The integrated circuit of claim 5, wherein a trigger condition comprises a determination that a voltage threshold for the variable gain amplifier is detected to be outside a predetermined range.

7. The integrated circuit of claim 5, wherein a trigger condition comprises a variable gain amplifier update counter reaching a predetermined count.

8. The integrated circuit of claim 5, wherein a first trigger condition comprises a determination that a voltage threshold for the variable gain amplifier is detected to be outside a predetermined range, and a second trigger condition comprises a variable gain amplifier update counter reaching a predetermined count.

9. A method of adaptation of a variable gain amplifier and a linear equalizer in an integrated circuit, the method comprising:

accumulating sign errors while incrementing an update counter, incrementing the error counter for positive sign errors, and decrementing the error counter for negative sign errors;

determining whether the update counter is greater than the error counter;

upon the update counter being greater than the error counter, determining if the adaptation of the variable gain amplifier is done;

if the adaptation of the variable gain amplifier is done, then freezing the gain of the variable gain amplifier and a direct current of the linear equalizer; and if the adaptation of the variable gain amplifier is not done, then determining whether a time-up condition is satisfied.

10. The method of claim 9 further comprising:

setting the error counter to a first count before accumulating the sign errors; and if the adaptation of the variable gain amplifier is not done and the time-up condition is satisfied, then setting the error counter to a second count that is higher than the first count.

11. The method of claim 10 further comprising:

if the adaptation of the variable gain amplifier is not done and the time-up condition is not satisfied, then updating a gain of the variable gain amplifier based on the accumulated sign errors.

12. The method of claim 11 further comprising:

after updating the gain, determining whether the gain has reached a maximum value or a minimum value;

if the gain has reached the maximum value or the minimum value, then determining if the gain of the variable gain amplifier has been frozen, and if so, then flagging a linear equalizer overflow if the maximum value was reached, and flagging a linear equalizer underflow if the minimum value was reached.

13. The method of claim 12, wherein the linear equalizer comprises multiple digital-to-analog conversion stages for setting a direct current voltage level, and wherein a sequence of stage settings is followed for setting the direct current voltage level.

14. The method of claim 13, wherein the sequence of stage settings goes from a first stage to a last stage and then loops back to the first stage.

15. The method of claim 13, wherein the sequence of stage settings goes through two settings of one stage before going to a next stage.

16. The method of claim 13, wherein the sequence of stage settings goes from a first setting to a last setting of one stage before going to a next stage.

17. The method of claim 9 further comprising:

performing an initial check of configuration bits to determine whether a manual adaptation of the variable gain amplifier is indicated; and performing the manual adaptation if indicated by the configuration bits.

* * * * *